(12) United States Patent
Kim

(10) Patent No.: US 8,492,975 B2
(45) Date of Patent: Jul. 23, 2013

(54) ORGANIC LIGHT EMITTING DIODE DISPLAY

(75) Inventor: Hoon Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/346,422

(22) Filed: Jan. 9, 2012

(65) Prior Publication Data

US 2012/0326603 A1    Dec. 27, 2012

(30) Foreign Application Priority Data

Jun. 21, 2011    (KR) .................... 10-2011-0060250

(51) Int. Cl.
*H01L 51/00*    (2006.01)

(52) U.S. Cl.
USPC .......................................... 313/512; 313/504

(58) Field of Classification Search
USPC ..................... 313/498–512; 445/25
See application file for complete search history.

(56) References Cited

U.S. PATENT DOCUMENTS

2003/0122476 A1* 7/2003 Wang et al. ............... 313/493
2007/0159094 A1* 7/2007 Oh et al. ..................... 313/512

FOREIGN PATENT DOCUMENTS

| KR | 10-2004-0053949 A | 6/2004 |
| KR | 10-2006-0018767 A | 3/2006 |
| KR | 10-2006-0065393 A | 6/2006 |

* cited by examiner

*Primary Examiner* — Anne Hines
(74) *Attorney, Agent, or Firm* — Christie, Parker & Hale, LLP

(57) ABSTRACT

An OLED display includes a pixel substrate including a pixel area at which an organic light emitting member is located, and a peripheral area surrounding the pixel area, a pixel protective layer located in the pixel area, a peripheral protective layer separated from the pixel protective layer and located in the peripheral area, a sealing substrate opposite to the pixel substrate, a moisture absorbent between the pixel substrate and the sealing substrate, and on and overlapping the peripheral protective layer, and a sealing member between the pixel substrate and the sealing substrate, and located at an outer side of the moisture absorbent.

8 Claims, 6 Drawing Sheets

ORGANIC LIGHT EMITTING DIODE DISPLAY

CROSS-REFERENCE TO RELATED APPLICATION

This application claims priority to and the benefit of Korean Patent Application No. 10-2011-0060250 filed in the Korean Intellectual Property Office on Jun. 21, 2011, the entire content of which is incorporated herein by reference.

BACKGROUND

1. Field

The described technology relates generally to an organic light emitting diode (OLED) display.

2. Description of Related Art

An organic light emitting diode (OLED) display includes two electrodes and an organic emission layer disposed between the two electrodes, and electrons injected from one electrode are coupled with holes injected from the other electrode in the organic emission layer to form excitons that emit light while emitting energy.

The organic light emitting diode display is self-illuminating, and does not need a separate light source, such that it has less thickness and weight in comparison to a liquid crystal display. In addition, since the organic light emitting diode display has high-grade characteristics, such as low power consumption, high luminance, high reaction speed, and the like, the organic light emitting diode display has been in the spotlight as a next-generation display device.

The organic emission layer may be deteriorated due to external factors such as external moisture, oxygen, or ultraviolet (UV) light, and thus, a technology that seals the organic emission layer is very important.

For a large-sized organic light emitting diode display, a moisture absorbent and a sealing member are used to reduce or prevent moisture permeation. However, when the moisture absorbent and the sealing member are formed on a protective layer formed of an organic layer, external moisture may reach the organic emission layer through the organic layer contacting the moisture absorbent, thereby causing deterioration of the organic emission layer. Thus, the moisture absorbent and the sealing member are formed in the peripheral area that is separated from the protective layer to prevent the above-stated problem so that the width of the peripheral area is increased, and accordingly, a bezel cannot be narrowed.

The above information disclosed in this Background section is only for enhancement of understanding of the background of the described technology and, therefore, it may contain information that does not form the prior art that is already known in this country to a person of ordinary skill in the art.

SUMMARY

Embodiments of the present invention provide an organic light emitting diode (OLED) display that can prevent moisture permeation while forming a narrow peripheral area.

An OLED display according to an exemplary embodiment of the present invention includes a pixel substrate including a pixel area at which an organic light emitting member is located, and a peripheral area surrounding the pixel area, a pixel protective layer located in the pixel area, a peripheral protective layer separated from the pixel protective layer and located in the peripheral area, a sealing substrate opposite to the pixel substrate, a moisture absorbent between the pixel substrate and the sealing substrate, and on and overlapping the peripheral protective layer, and a sealing member between the pixel substrate and the sealing substrate, and located at an outer side of the moisture absorbent.

The moisture absorbent may partially contact the pixel substrate.

The moisture absorbent may surround the pixel protective layer.

The sealing member may surround the moisture absorbent.

The pixel protective layer and the peripheral protective layer may be separated by a first separation distance of about 1 μm to 20 mm.

The pixel area may include an emission pixel configured to emit light, a dummy pixel surrounding the emission pixel, a first pixel protective layer covering a periphery of the emission pixel, and a second pixel protective layer covering the dummy pixel and separated from the first pixel protective layer.

The first pixel protective layer and the second pixel protective layer are separated by a second separation distance of about 1 μm to 20 mm.

In the OLED display according to embodiments of the present invention, the pixel protective layer and the peripheral protective layer formed of an organic layer have a separation distance (e.g., a predetermined separation distance) therebetween, so that movement of moisture absorbed to the peripheral protective layer to the pixel protective layer is blocked, thereby reducing or preventing moisture permeation.

In addition, since the moisture permeation is reduced or prevented by separating the pixel protective layer and the peripheral protective layer with the separation distance (e.g., the predetermined separation distance), the moisture absorbent and the peripheral protective layer can be formed in an overlapped manner, so that the peripheral area can be narrowed, thereby reducing or minimizing an outer margin.

DETAILED DESCRIPTION

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
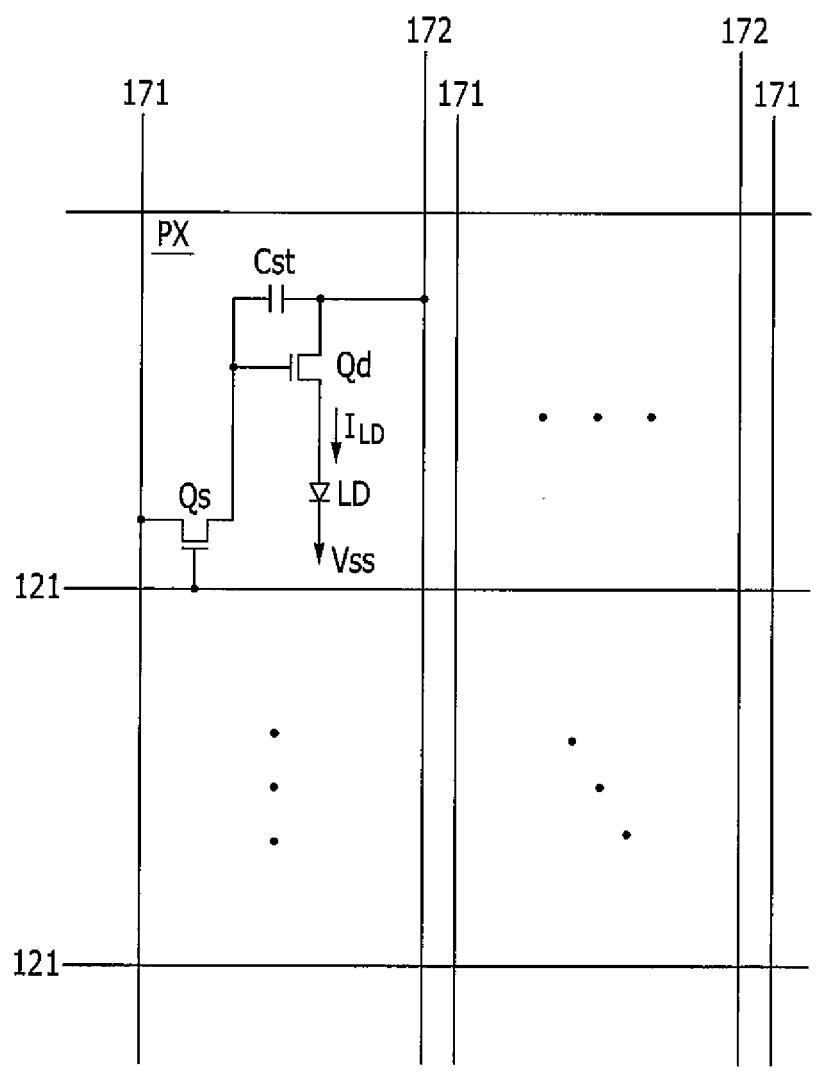
FIG. 1 is an equivalent circuit diagram of an organic light emitting diode (OLED) display according to an exemplary embodiment of the present invention.

FIG. 1 is an equivalent circuit diagram of an organic light emitting diode (OLED) display according to an exemplary embodiment of the present invention.

Referring to FIG. 1, the OLED display according to the present exemplary embodiment includes a plurality of signal lines 121, 171, and 172, and a plurality of pixels PX electrically coupled to the plurality of signal lines 121, 171, and 172 and substantially arranged in a matrix format.

The signal lines include a plurality of gate lines 121 for transmitting a gate signal (or, a scan signal), a plurality of data lines 171 for transmitting a data signal, and a plurality of driving voltage lines 172 for transmitting a driving voltage. The gate lines 121 substantially extend in a row direction and are substantially parallel with each other, and the data lines 171 and the driving voltage lines 172 substantially extend in a column direction and are substantially parallel with each other.

Each pixel PX includes a switching thin film transistor Qs, a driving thin film transistor Qd, a storage capacitor Cst, and an organic light emitting diode (OLED) LD.

The switching thin film transistor Qs includes a control terminal, an input terminal, and an output terminal. The control terminal is coupled to the gate line 121, the input terminal is coupled to the data line 171, and the output terminal is coupled to the driving thin film transistor Qd. The switching thin film transistor Qs transmits a data signal applied to the data line 171 to the driving thin film transistor Qd in response to a scan signal applied to the gate line 121.

The driving thin film transistor Qd also includes a control terminal, an input terminal, and an output terminal. The control terminal is coupled to the switching thin film transistor Qs, the input terminal is coupled to the driving voltage line 172, and the output terminal is coupled to the OLED LD. The driving thin film transistor Qd flows an output current ILD varying in size depending on a voltage between the control terminal and the output terminal.

The capacitor Cst is coupled between the control terminal and the input terminal of the driving thin film transistor Qd. The capacitor Cst charges the data signal applied to the control terminal of the driving thin film transistor Qd and maintains the charge of the data signal after the switching thin film transistor Qs is turned off.

The OLED LD includes an anode coupled to the output terminal of the driving thin film transistor Qd and a cathode coupled to a common voltage Vss. The OLED LD displays an image by emitting light with intensity that varies depending on the output current ILD of the driving thin film transistor Qd.

According to the present embodiment, the switching thin film transistor Qs and the driving thin film transistor Qd are n-channel field effect transistors (FETs). However, at least one of the switching thin film transistor Qs and the driving thin film transistor Qd may be a p-channel field effect transistor. In addition, a connection relation between the thin film transistors Qs and Qd, the capacitor Cst, and the OLED LD may be changed without departing from the spirit or the scope of the present invention.

A structure of the OLED display of the embodiment shown in FIG. 1 will be described in further detail with reference to FIG. 2 to FIG. 4, together with FIG. 1.

Figure 2:
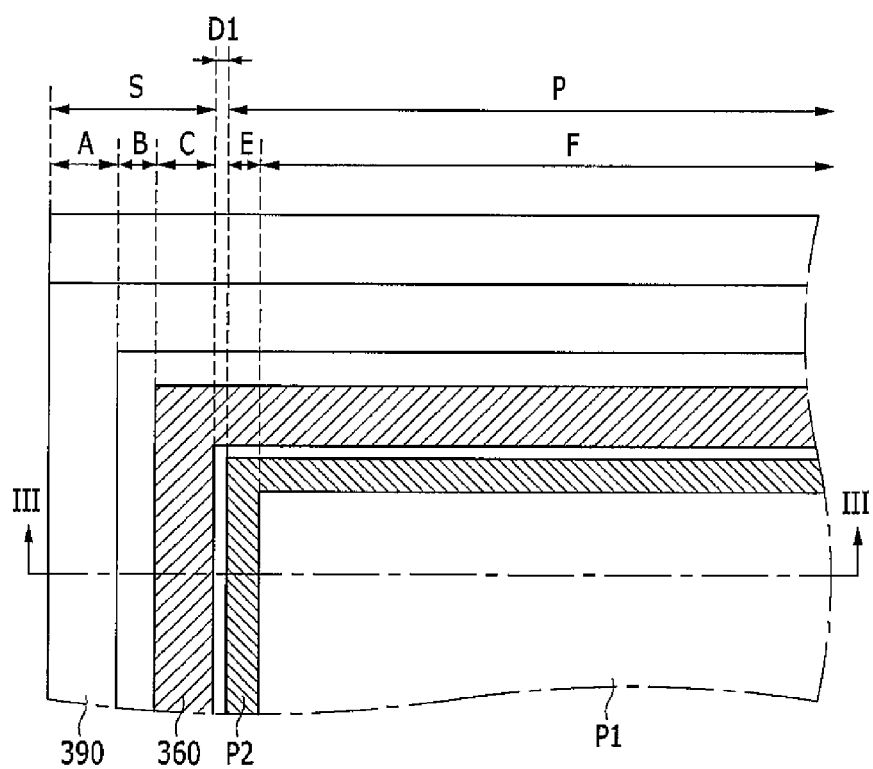
FIG. 2 is a top plan view of a part of the OLED display according to the exemplary embodiment shown in FIG. 1.
Figure 3:
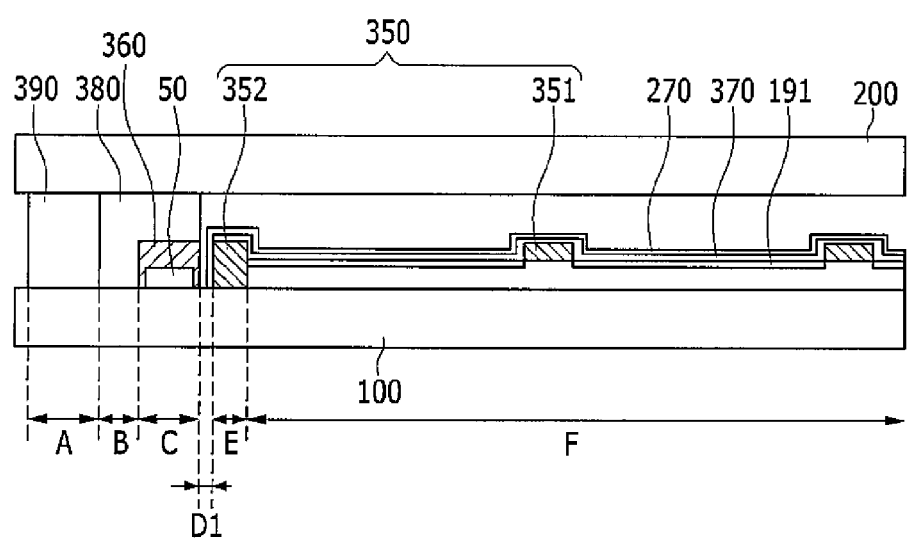
FIG. 3 is a cross-sectional view of the part of the OLED display of the exemplary embodiment shown in FIG. 2, taken along the line III-III.
Figure 4:
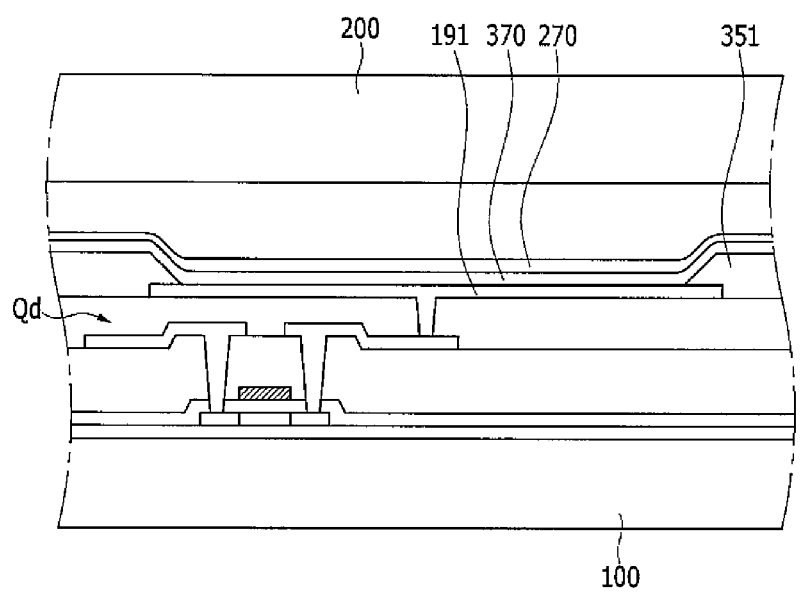
FIG. 4 is an enlarged cross-sectional view of a pixel area of the part of the OLED display of the exemplary embodiment shown in FIG. 2.

FIG. 2 is a top plan view of a part of the OLED display according to the present exemplary embodiment, FIG. 3 is a cross-sectional view of the part of the OLED display of the embodiment shown in FIG. 2, taken along the line III-III, and FIG. 4 is a cross-sectional view of a pixel area of the part of the OLED display shown in FIG. 2.

As shown in FIG. 2 to FIG. 4, the OLED display according to the present exemplary embodiment includes a pixel area P where an organic light emitting member 370 forming the OLED LD is formed, a pixel substrate 100 surrounding the pixel area P and including a peripheral area S where a driving circuit 50 is formed, and a sealing substrate 200 arranged opposite to the pixel substrate 100 and covering the pixel substrate 100.

The pixel area P includes an emission pixel P1 emitting light and a dummy pixel P2 surrounding the emission pixel P1. The dummy pixel P2 is provided to repair the emission pixel P1 when the emission pixel P1 is damaged, and does not emit light.

In the pixel area P of the pixel substrate 100, a switching thin film transistor Qs, a driving thin film transistor Qd, a pixel electrode 191, a pixel protective layer 350, an organic light emitting member 370, and a common electrode 270 are formed.

The pixel electrode 191 is coupled with the driving thin film transistor Qd, and may be made of a transparent conductor such as ITO or IZO.

A pixel protective layer 350 formed of an organic layer is formed on the pixel electrode 191. The pixel protective layer 350 has an opening that exposes the pixel electrode 191 by surrounding the periphery of the edge of the pixel electrode 191. The pixel protective layer 350 includes a first pixel protective layer 351 covering the emission pixel P1, and a second pixel protective layer 352 covering the dummy pixel P2.

In the peripheral area S, a peripheral protective layer 360 is formed on the same layer where the pixel protective layer 350 is formed. The peripheral protective layer 360 is made of the same material of the pixel protective layer 350, and is separated from the pixel protective layer 350. The pixel protective layer 350 and the peripheral protective layer 360 may maintain a first separation distance D1 of about 1 μm to 20 mm.

When the first separation distance D1 is smaller than 1 μm, moisture absorbed by the peripheral protective layer 360 may move to the pixel protective layer 350, thereby causing damage to the organic light emitting member 370. In addition, when the first separation distance D1 is larger than 20 mm, the width of the peripheral area S is increased so that a narrow bezel cannot be formed.

On the pixel protective layer 350, the organic light emitting member 370 is formed. The organic light emitting member 370 may include an auxiliary layer (not shown) for additionally improving light emission efficiency of the organic emission layer that emits light. The auxiliary layer may be at least one selected from an electron transport layer (ETL), a hole transport layer (HTL), an electron injection layer (EIL), or a hole injection layer (HIL).

The common electrode 270 is formed on the organic light emitting member 370. The common electrode 270 may be made of a metal having high reflectivity. The common electrode 270 is formed over substantially the entire surface of the substrate, forms a pair with the pixel electrode 191, and flows a current to the organic light emitting member 370.

The pixel electrode 191, the organic light emitting member 370, and the common electrode 270 form the OLED LD. The pixel electrode 191 may be an anode, and the common electrode 270 may be a cathode. In other embodiments, the pixel electrode 191 may be a cathode, and the common electrode 270 may be an anode.

A moisture absorbent 380 is formed in the peripheral area S between the pixel substrate 100 and the sealing substrate 200 to absorb moisture. Such a moisture absorbent 380 is formed on the peripheral protective layer 360 while overlapping the same. A pair of the moisture absorbent 380 contacts the pixel substrate 100 and surrounds the pixel protective layer 350.

A sealing member 390 is formed in the peripheral area S between the pixel substrate 100 and the sealing substrate 200 to seal the pixel substrate 100 and the sealing substrate 200. The sealing member 390 is formed at an outer side of the moisture absorbent 380 while surrounding the moisture absorbent 380.

FIG. 2 and FIG. 3 illustrate a width A of the sealing member 390, a width B where the moisture absorbent 380 contacts the pixel substrate 100, a width C of the peripheral protective layer 360, the first separation distance D1, a width E of the second pixel protective layer 352, and a width F of the first pixel protective layer 351.

As described, the pixel protective layer 350 and the peripheral protective layer 360 that are formed of an organic layer have the first separation distance D1 therebetween so that movement of moisture absorbed to the peripheral protective layer 360 from the outside (e.g., external moisture) toward the pixel protective layer 350 is blocked, thereby reducing or preventing moisture permeation.

In this case, when the peripheral protective layer 360 is formed under the moisture absorbent 380 for absorbing moisture in an overlapped manner, moisture absorbed to the peripheral protective layer 360 cannot easily be moved to the pixel protective layer 350. Thus, since the moisture absorbent 380 and the peripheral protective layer 360 can be overlapped with each other, the peripheral area S can be narrowed so that an outer margin can be minimized.

In addition, since moisture permeation can be reduced or prevented by separating the pixel protective layer 350 and the peripheral protective layer 360, optimization of performance of the moisture absorbent 380 is not necessary.

Although only the pixel protective layer 350 and the peripheral protective layer 360 are separated in the above-stated exemplary embodiment of the present invention, the first pixel protective layer 351 that covers the emission pixel P1 in the pixel area P and the second pixel protective layer 352 that covers the dummy pixel P2 in the pixel area P may also be separated.

Figure 5:
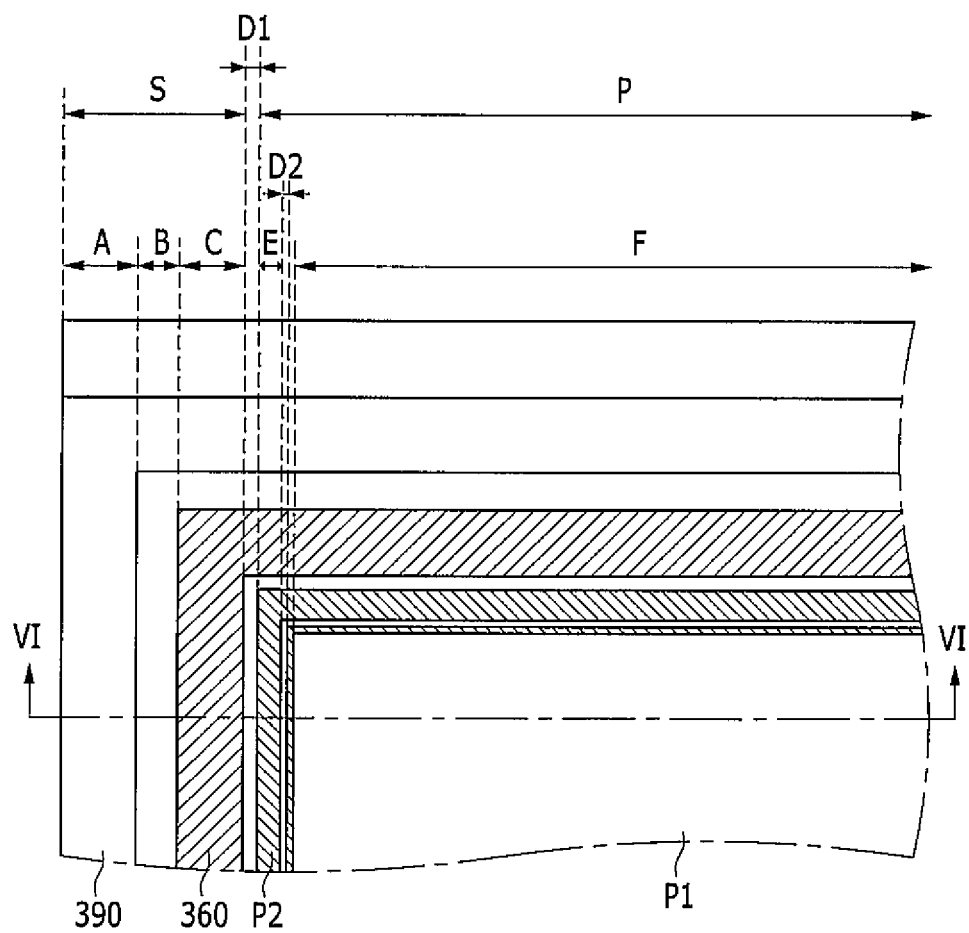
FIG. 5 is a top plan view of a part of an OLED display according to another exemplary embodiment of the present invention.
Figure 6:
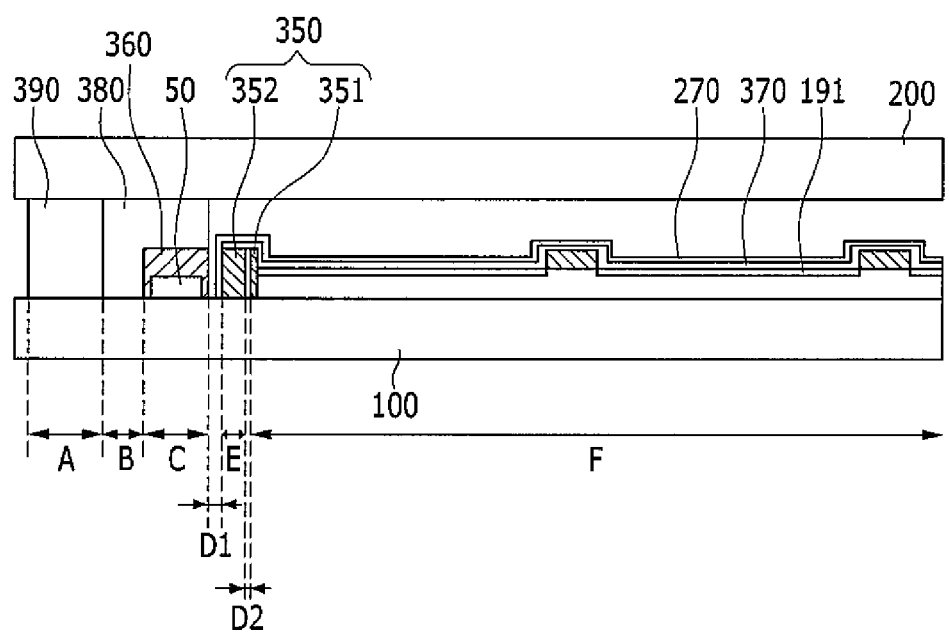
FIG. 6 is a cross-sectional view of the part of an OLED display of the embodiment shown in FIG. 5, taken along the line VI-VI.

FIG. 5 is a top plan view of a part of an OLED display according to another exemplary embodiment of the present invention, and FIG. 6 is a cross-sectional view of the top plan view of a part of an OLED display shown in FIG. 5, taken along the line VI-VI.

An exemplary embodiment shown in FIG. 5 and FIG. 6 is substantially the same as the exemplary embodiment shown in FIG. 2 and FIG. 3, except that a first pixel protective layer 351 and the second protective layer 352 are separated from each other, and accordingly repeated descriptions will be omitted.

As shown in FIG. 5 and FIG. 6, a pixel area P includes an emission pixel P1 emitting light and a dummy pixel P2 surrounding the emission pixel P1.

A pixel protective layer 350 formed of an organic layer is formed on the pixel area P. The pixel protective layer 350 has an opening that exposes the pixel electrode 191 by surrounding the peripheral of the edge of the pixel electrode 191. The pixel protective layer 350 includes a first pixel protective layer 351 covering a periphery of the emission pixel P1 and a second pixel protective layer 352 covering the dummy pixel P2. The first pixel protective layer 351 and the second pixel protective layer 352 are separated from each other.

The first pixel protective layer 351 and the second pixel protective layer 352 may maintain a second separation distance D2 of about 1 μm to 20 mm.

When the second separation distance D2 is smaller than 1 μm, moisture absorbed to the peripheral protective layer 360 may move to the second pixel protective layer 352, thereby causing damage to an organic light emitting member 370. In addition, when the second separation distance D2 is larger than 20 mm, a distance between the emission pixel P1 and the dummy pixel P2 is increased so that an aperture ratio may be decreased.

As described, the first pixel protective layer 351 and the second pixel protective layer 352 that are formed of an organic layer have the second separation distance D2 therebetween so that movement of moisture absorbed to the peripheral protective layer 360 from the outside toward the second pixel protective layer 352 is blocked, thereby reducing or preventing moisture permeation.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

| Description of Some of the Reference Characters | |
| --- | --- |
| 100: | pixel substrate |
| 200: | sealing substrate |
| 350: | pixel protective layer |
| 351: | first pixel protective layer |
| 352: | second pixel protective layer |
| 360: | peripheral protective layer |
| 380: | moisture absorbent |
| 390: | sealing member |

What is claimed is:

1. An organic light emitting diode (OLED) display comprising:
   a pixel substrate comprising:
      a pixel area at which an organic light emitting member is located; and
      a peripheral area surrounding the pixel area;
   a pixel protective layer located in the pixel area between the organic light emitting member and the pixel substrate;
   a peripheral protective layer separated from the pixel protective layer and located in the peripheral area;
   a sealing substrate opposite to the pixel substrate;
   a moisture absorbent between the pixel substrate and the sealing substrate, and on and overlapping the peripheral protective layer; and
   a sealing member between the pixel substrate and the sealing substrate, and located at an outer side of the moisture absorbent.

2. The OLED display of claim 1, wherein the moisture absorbent partially contacts the pixel substrate.

3. The OLED display of claim 1, wherein the moisture absorbent surrounds the pixel protective layer.

4. The OLED display of claim 1, wherein the sealing member surrounds the moisture absorbent.

5. The OLED display of claim 1, wherein the pixel protective layer and the peripheral protective layer are separated by a first separation distance of about 1 μm to 20 mm.

6. The OLED display of claim 1, further comprising:
   an emission pixel at the pixel area and comprising the organic light emitting member and configured to emit light; and
   a dummy pixel surrounding the emission pixel, wherein the pixel protective layer comprises:
a first pixel protective layer covering a periphery of the emission pixel; and
a second pixel protective layer covering the dummy pixel and separated from the first pixel protective layer.

7. The OLED display of claim 6, wherein the first pixel protective layer and the second pixel protective layer are separated by a second separation distance of about 1 µm to 20 mm.

8. The OLED display of claim 1, further comprising a driving circuit at the peripheral area,
wherein the peripheral protective layer is on the driving circuit.

* * * * *